(12) United States Patent
Hikita et al.

(10) Patent No.: US 8,598,628 B2
(45) Date of Patent: Dec. 3, 2013

(54) SEMICONDUCTOR DEVICE (75) Inventors: Masahiro Hikita, Hyogo (JP); Manabu Yanagihara, Osaka (JP)

(73) Assignee: Panasonic Corporation, Osaka (JP)

( * ) Notice: Subject to any disclaimer, the term of this patent is extended or adjusted under 35 U.S.C. 154(b) by 295 days.

(21) Appl. No.: 13/231,514

(22) Filed: Sep. 13, 2011

(65) Prior Publication Data

US 2012/0068227 A1 Mar. 22, 2012

(30) Foreign Application Priority Data

Sep. 17, 2010 (JP) ................... 2010-210139

(51) Int. Cl.
*H01L 29/72* (2006.01)

(52) U.S. Cl.
USPC .............. 257/194; 257/192; 257/E29.246

(58) Field of Classification Search
USPC ................... 257/192, 194, E29.246
See application file for complete search history.

(56) References Cited

U.S. PATENT DOCUMENTS

| | | | |
|---|---|---|---|
| 7,038,252 B2 | 5/2006 | Saito et al. | |
| 7,465,997 B2 | 12/2008 | Kinzer et al. | |
| 7,508,015 B2 | 3/2009 | Saito et al. | |
| 2005/0189559 A1 | 9/2005 | Saito et al. | |
| 2006/0138454 A1 | 6/2006 | Saito et al. | |
| 2007/0145415 A1 | 6/2007 | Inoue et al. | |
| 2007/0278521 A1 | 12/2007 | Ishida et al. | |
| 2009/0166677 A1 | 7/2009 | Shibata et al. | |
| 2010/0102357 A1 | 4/2010 | Sato | |
| 2010/0320505 A1* | 12/2010 | Okamoto et al. | 257/192 |

FOREIGN PATENT DOCUMENTS

| | | |
|---|---|---|
| JP | 2005-244072 A | 9/2005 |
| JP | 2005-244075 A | 9/2005 |
| JP | 2010-182924 A | 8/2010 |

* cited by examiner

*Primary Examiner* — Edward Wojciechowicz
(74) *Attorney, Agent, or Firm* — McDermott Will & Emery LLP (57) ABSTRACT

A normally off semiconductor device with a reduced off-state leakage current, which is applicable to a power switching element, includes: a substrate; an undoped GaN layer formed above the substrate; an undoped AlGaN layer formed on the undoped GaN layer; a source electrode and a drain electrode, formed on the undoped GaN layer or the undoped AlGaN layer; a P-type GaN layer formed on the undoped AlGaN layer and disposed between the source electrode and the drain electrode; and a gate electrode formed on the P-type GaN layer, wherein the undoped GaN layer includes an active region including a channel and an inactive region not including the channel, and the P-type GaN layer is disposed to surround the source electrode.

16 Claims, 9 Drawing Sheets

SEMICONDUCTOR DEVICE

BACKGROUND OF THE INVENTION (1) Field of the Invention

The present invention relates to semiconductor devices applicable to power switching elements, for example, in power supply circuits of consumer appliances such as a television.

(2) Description of the Related Art

In recent years, field effect transistors (FETs) made from a gallium nitride (GaN)-based material have been intensively studied as power switching devices. A nitride semiconductor material such as GaN forms various types of mixed crystal together with aluminum nitride (AlN) and indium nitride (InN) and therefore forms a heterojunction like the conventionally-used arsenic-based semiconductor material such as gallium arsenide (GaAs). In particular, a heterojunction of a nitride semiconductor has a characteristic that spontaneous polarization and piezoelectric polarization produce a high concentration of carriers at the hetero-interface even when the nitride semiconductor is not doped. As a result, FETs using nitride semiconductors are likely to exhibit the depletion mode (normally on mode), and it is thus difficult to obtain characteristics of the enhancement mode (normally off mode). However, most of the devices used in the power electronics market today are in the normally off mode, and there is therefore a strong demand for GaN-based nitride semiconductor devices in the normally off mode.

As a structure which provides the normally off FETs, a junction field effect transistor (JFET) has been proposed in which a P-type GaN layer is formed in the gate region (see Patent Reference 1: Japanese Patent Application Publication NO. 2005-244072, for example). In the JFET structure, piezoelectric polarization occurring at the hetero-interface between the undoped GaN channel layer and the AlGaN barrier layer is offset by piezoelectric polarization occurring at the hetero-interface between the AlGaN barrier layer and the P-type GaN layer. This makes it possible to lower the concentration of two-dimensional electron gas in the P-type GaN layer right below the gate region, thereby providing a normally off characteristic. In addition, when the gate includes a p-n junction having a larger built-in potential than a schottky junction, the gate turn on voltage can be higher, which produces an advantage that the gate leakage current can be smaller even when a positive gate voltage is applied.

SUMMARY OF THE INVENTION

Figure 10:
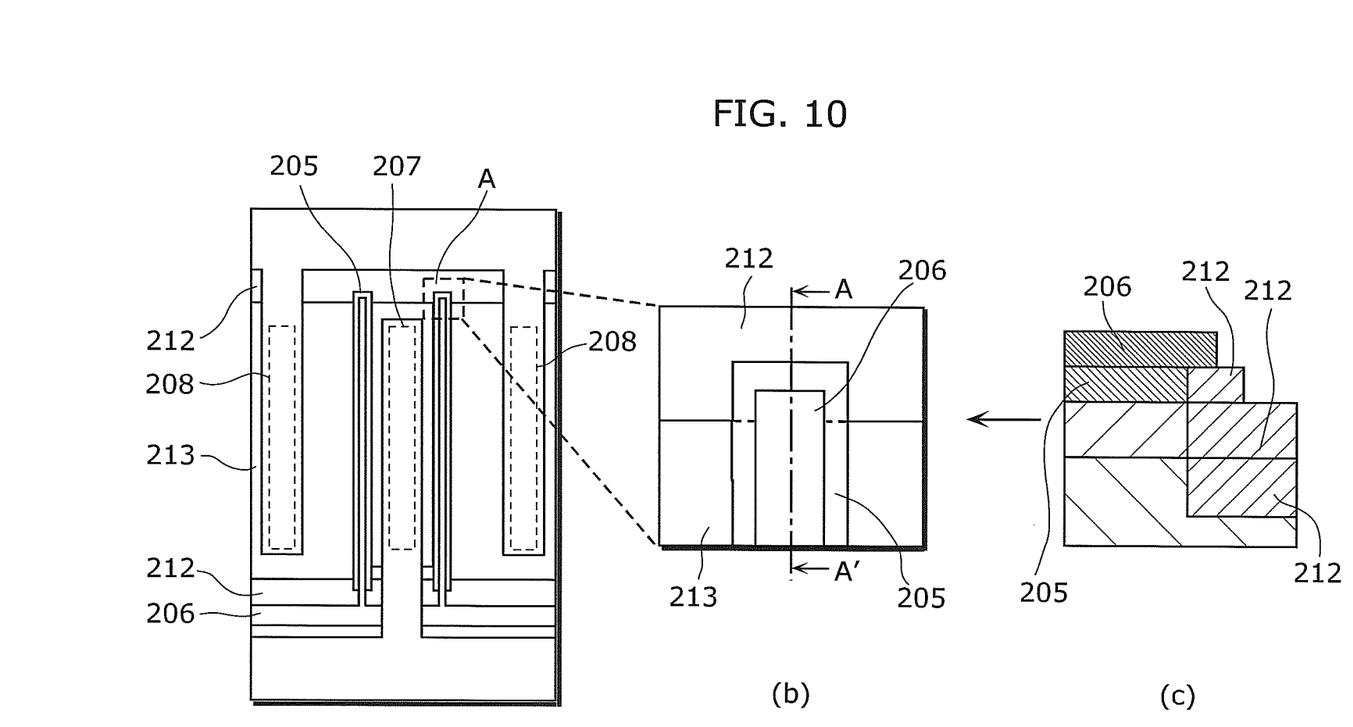
FIG. 10 includes, in (a), a top view showing a structure of a JFET made from a nitride semiconductor, and in (b), a top view of a detailed structure of the JFET (an enlarged view of an A part of (a)), and in (c), a cross-sectional view of a detailed structure of the JFET (a cross-sectional view taken along line A-A' of (b))

In FIG. 10, (a) is a top view showing a structure of a JFET made from a nitride semiconductor, (b) is a top view showing a detailed structure of the JFET (an enlarged view of an A part of (a)), and (c) is a cross-sectional view showing a detailed structure of the JFET (a cross-sectional view taken along line A-A' of (b)).

A FET in such a size that the gate width is beyond several millimeters generally adopts a comb structure which repeats a layout in which a source electrode 207, a gate electrode 206, and a drain electrode 208 are sequentially arranged as shown in (a) of FIG. 10 in order that the electrodes are efficiently arranged. In the JFET having the comb structure, the gate electrode 206, together with the underlying P-type GaN layer 205, crosses an active region 213 where carriers are present, and extends to an inactive region 212 where carriers are absent. The inactive region 212 is a region necessary to define the boundary from the active region 213, be separated from other elements, and reduce the parasitic capacitance of the regions in which the electrode pad, the lines, and the like elements are formed. As shown in (b) and (c) of FIG. 10, the P-type GaN layer 205 and the channel above the inactive region 212 have the resistance increased by the ion implantation method, or contain no carriers due to etching.

Figure 11:
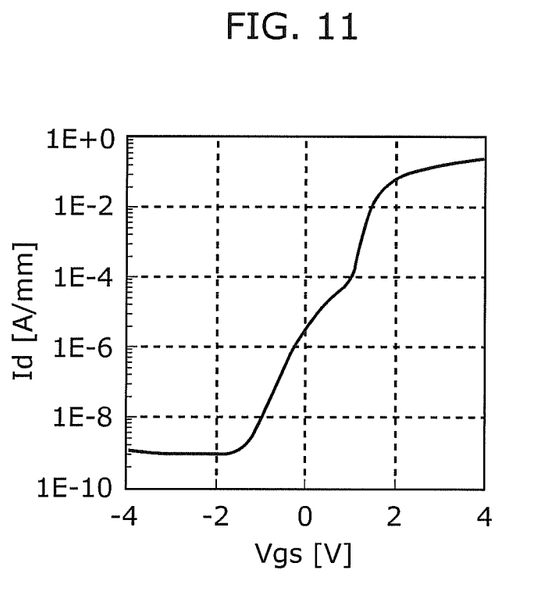
FIG. 11 shows the drain current-gate voltage characteristics of the JFET of FIG. 10.

However, the JFET made from a nitride semiconductor shown in FIG. 10 exhibits, as shown in FIG. 11, the drain current-gate voltage characteristics in which a rising edge of the drain current is not sharp, resulting in a problem of a large off-state leakage current at zero gate voltage in spite of the normally off characteristics with a threshold voltage of approximately 1V. Considering the application to power switching elements, the leakage current needs to be sufficiently small in order to reduce an off-state conduction loss.

The path of this off-state leakage current is considered to be the interface between the active region 213 and the inactive region 212, which is located at a part which the gate electrode 206 crosses, shown in the enlarged view (b) of FIG. 10. In the JFET made from a nitride semiconductor, the carrier concentration is controlled by the potential of the P-type GaN layer 205 above the channel so that an ON state and an OFF state are set, and it is considered that there is the leakage current because the potential at the interface between the active region 213 and the inactive region 212 is different from the potential in the active region 213. Referring to the cross-sectional view of (c) in FIG. 10 taken along the gate fingers, it seems that, at zero gate voltage, the carriers in the active region 213 are completely gone while the carriers in the channel part at the interface between the active region 213 and the inactive region 212 are not completely gone.

In view of the above problem, an object of the present invention is to provide a normally off semiconductor device with a reduced off-state leakage current, which is applicable to a power switching element.

In order to solve the above problem, the semiconductor device according to an aspect of the present invention includes: a substrate; a first nitride semiconductor layer formed above the substrate; a second nitride semiconductor layer formed on the first nitride semiconductor layer and having a higher bandgap energy than the first nitride semiconductor layer; a source electrode and a drain electrode which are formed on one of the first nitride semiconductor layer and the second nitride semiconductor layer; a third nitride semiconductor layer of P-type conductivity formed on the second nitride semiconductor layer and disposed between the source electrode and the drain electrode; and a gate electrode formed on the third nitride semiconductor layer, wherein the first nitride semiconductor layer includes an active region and an inactive region, the active region including a channel, and the inactive region not including the channel, and the third nitride semiconductor layer is disposed to surround at least one of the source electrode and the drain electrode.

With this structure, the off-state leakage current at zero gate voltage can be reduced.

As described above, with the semiconductor device according to an aspect of the present invention, it is possible to provide a normally off semiconductor device with reduced off-state leakage current at zero gate voltage and with reduced on-resistance. That is, a normally off JFET can be attained.

FURTHER INFORMATION ABOUT TECHNICAL BACKGROUND TO THIS APPLICATION

The disclosure of Japanese Patent Application No. 2010-210139 filed on Sep. 17, 2010 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

The following describes embodiments of the present invention with reference to the drawings.

It is to be noted that constituents substantially the same in structure, operation, and effect are labeled with the same reference numerals throughout the drawings. Furthermore, all the numerical values set forth in the descriptions below are illustrative to explain the present invention specifically, and the present invention is not limited to the illustrated numerical values. In addition, the source electrode and the drain electrode of a transistor are mostly of the same structure and function and often not clearly distinguished from each other, but, in the descriptions below, an electrode to which signals are input is represented as a source electrode and an electrode from which signals are output is represented as a drain electrode, for the sake of convenience.

First Embodiment

Figure 1:
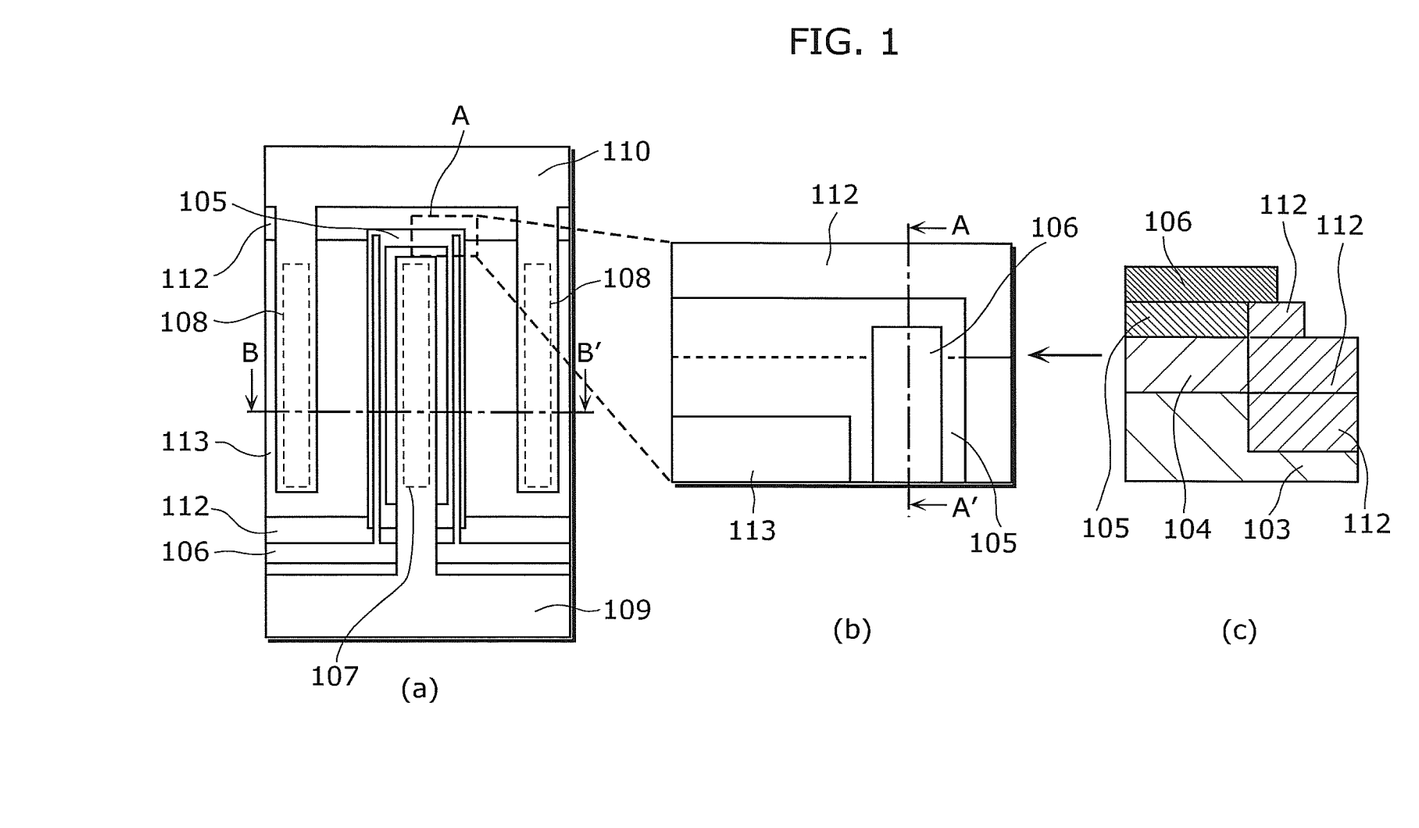
FIG. 1 includes, in (a), a top view showing a structure of a semiconductor device according to the first embodiment of the present invention, and in (b), a top view showing a detailed structure of the semiconductor device (an enlarged view of an A part of (a)), and in (c), a cross-sectional view showing a detailed structure of the semiconductor device (a cross-sectional view taken along line A-A' of (b))
Figure 2:
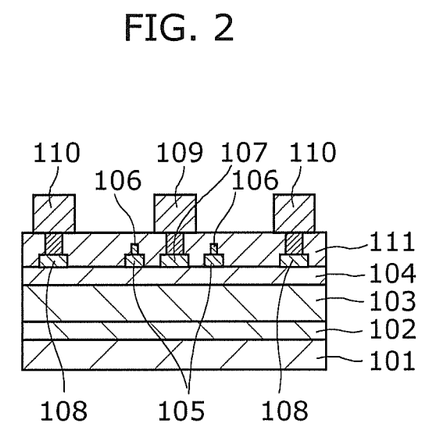
FIG. 2 is a cross-sectional view showing a structure of the semiconductor device according to the first embodiment of the present invention (a cross-sectional view taken along line B-B' of (a) in FIG. 1)

In FIG. 1, (a) is a top view showing a structure of a semiconductor device according to the first embodiment of the present invention, (b) is a top view showing a detailed structure of the semiconductor device (an enlarged view of an A part of (a)), and (c) is a cross-sectional view showing a detailed structure of the semiconductor device (a cross-sectional view taken along line A-A' of (b)). FIG. 2 is a cross-sectional view showing a detailed structure of the semiconductor device (a cross-sectional view taken along line B-B' of (a) in FIG. 1).

As shown in FIG. 2, the semiconductor device according to the present embodiment is a JFET made from a nitride semiconductor, which includes: a substrate 101 made from sapphire, for example; a buffer layer 102 formed on, for example, a surface (0001) of the substrate 101 and being, for example, 100 nm in thickness and made from AlN; an undoped GaN layer (i-GaN layer) 103 formed on the buffer layer 102 and being 2 µm in thickness; an undoped AlGaN layer (i-AlGaN layer) 104 formed on the undoped GaN layer 103, the undoped AlGaN layer 104 being 25 nm in thickness and containing 15 percent Al; a P-type GaN layer 105 formed on a gate region of the undoped AlGaN layer 104 and being 100 nm in thickness; a gate electrode 106 formed on the P-type GaN layer 105; a source electrode 107, a drain electrode 108, and an insulating film 111, that are formed on the undoped AlGaN layer 104; a source line 109 coupled to the source electrode 107 through a contact; and a drain line 110 coupled to the drain electrode 108 through a contact.

Here, "undoped" indicates no impurities introduced intentionally. The undoped GaN layer 103 is a channel layer which is an example of the first nitride semiconductor layer according to an implementation of the present invention. The undoped AlGaN layer 104 is a barrier layer which is an example of the second nitride semiconductor layer according to an implementation of the present invention, and has a higher bandgap energy than the first nitride semiconductor layer. The P-type GaN layer 105 is a gate layer constituting the gate, which is an example of the third nitride semiconductor layer according to an implementation of the present invention, and disposed between the source electrode 107 and the drain electrode 108.

The undoped GaN layer 103 and the undoped AlGaN layer 104 layer include an active region 113 in which the channel (carrier) is included (which region forms the channel), and an inactive region 112 in which the channel (carrier) is not included (which region does not form the channel). The P-type GaN layer 105 is disposed to surround the source electrode 107.

The inactive region 112 is a region which is included in the undoped GaN layer 103 and the undoped AlGaN layer 104 and has the resistance increased by ion implantation of non-conducting impurities or the like, and the active region 113 is the other region which has the resistance not increased.

On the p-type GaN layer 105, the gate electrode 106 made from Pd is placed in ohmic contact with the P-type GaN layer 105. On the undoped AlGaN layer 104, the source electrode 107 and the drain electrode 108 are placed each of which is made up of a Ti layer and an Al layer that are in ohmic contact with the channel formed at the interface between the undoped AlGaN layer 104 and the undoped GaN layer 103. The gate electrode 106, the source electrode 107, and the drain electrode 108 are placed with the insulating film 111 held therebetween. On the source electrode 107, the source line 109 is placed; on the drain electrode 108, the drain line 110 is placed.

On the undoped AlGaN layer 104, the P-type GaN layer 105 and the gate electrode 106 are formed at a position closer to the source electrode 107. This is to improve the breakdown pressure of the semiconductor device by increasing the distance between the gate electrode 106 and the drain electrode 108 so that the electric field generated by application of high drain voltage is reduced.

The large part of the P-type GaN layer 105 is doped with magnesium (Mg) of approximately $1 \times 10^{19}$ cm$^{-3}$ and has a carrier concentration of approximately $1 \times 10^{18}$ cm$^{-3}$, but the approximately 10 nm part of the P-type GaN layer 105 right below the gate electrode 106 is doped with Mg of approximately $1 \times 10^{20}$ cm$^{-3}$.

As shown in (a) in FIG. 1, the semiconductor device according to the present embodiment adopts a comb structure which repeats a layout in which the source electrode 107, the gate electrode 106, and the drain electrode 108 are sequentially arranged. Outside the comb structure (outside the active region 113), the inactive region 112 is formed by ion implantation of boron (B) or iron (Fe), for example, and the source line 109, the drain line 110, and the gate electrode 106 extend to above the inactive region 112. The gate electrode 106, together with the underlying P-type GaN layer 105, crosses the active region 113 in which carriers are present; in other words, crosses the interface between the inactive region 112 and the active region 113, and extends to the inactive region 112 in which no carriers are present. The inactive region 112 is a region necessary to define the boundary from the active region 113, be separated from other elements, and reduce the parasitic capacitance of the regions in which the electrode pad, the lines, and the like elements are formed. As shown in (b) and (c) of FIG. 1, the P-type GaN layer 105 and the channel inside the inactive region 112 have the resistance increased by the ion implantation method, or contain no carriers due to etching.

In the semiconductor device according to the present embodiment, the P-type GaN layer 105 is disposed to surround the source electrode 107, and the inactive region 112 is formed in contact with the P-type GaN layer 105. As a result of the above structure, electrons moving from the source electrode 107 to the drain electrode 108 always pass through the channel underneath the P-type GaN layer 105 inside the active region 113. Thus, at the interface between the active region 113 and the inactive region 112, there is no longer the path for electrons to pass through the gate region, which path was present in the semiconductor device of FIG. 10. The above structure can therefore reduce the leakage current which flows at zero gate voltage and with the drain current blocked.

Figure 3:
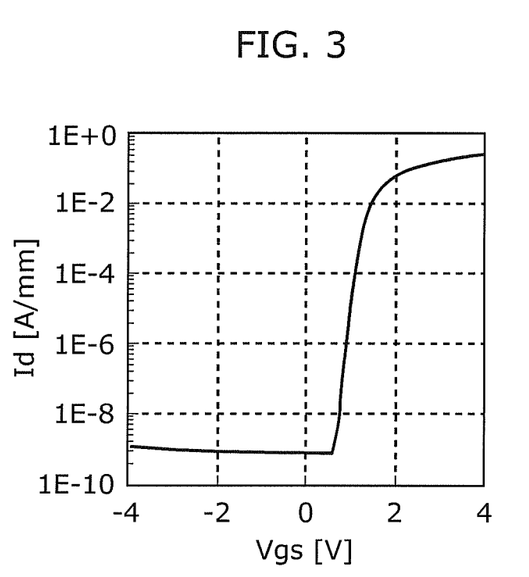
FIG. 3 shows the drain current-gate voltage characteristics of the semiconductor device according to the first embodiment of the present invention.

FIG. 3 shows the drain current-gate voltage characteristics of the semiconductor device according to the present embodiment. The characteristics shown in FIG. 3 are obtained when the drain voltage is 10 V.

In FIG. 3, the drain current rises sharply from around 1 V of the gate voltage, and the drain current is approximately $1 \times 10^{-9}$ A/mm at the zero gate voltage. This shows that the semiconductor device according to the present embodiment has a sufficiently low leakage current as a normally off transistor.

First Variation

Figure 4:
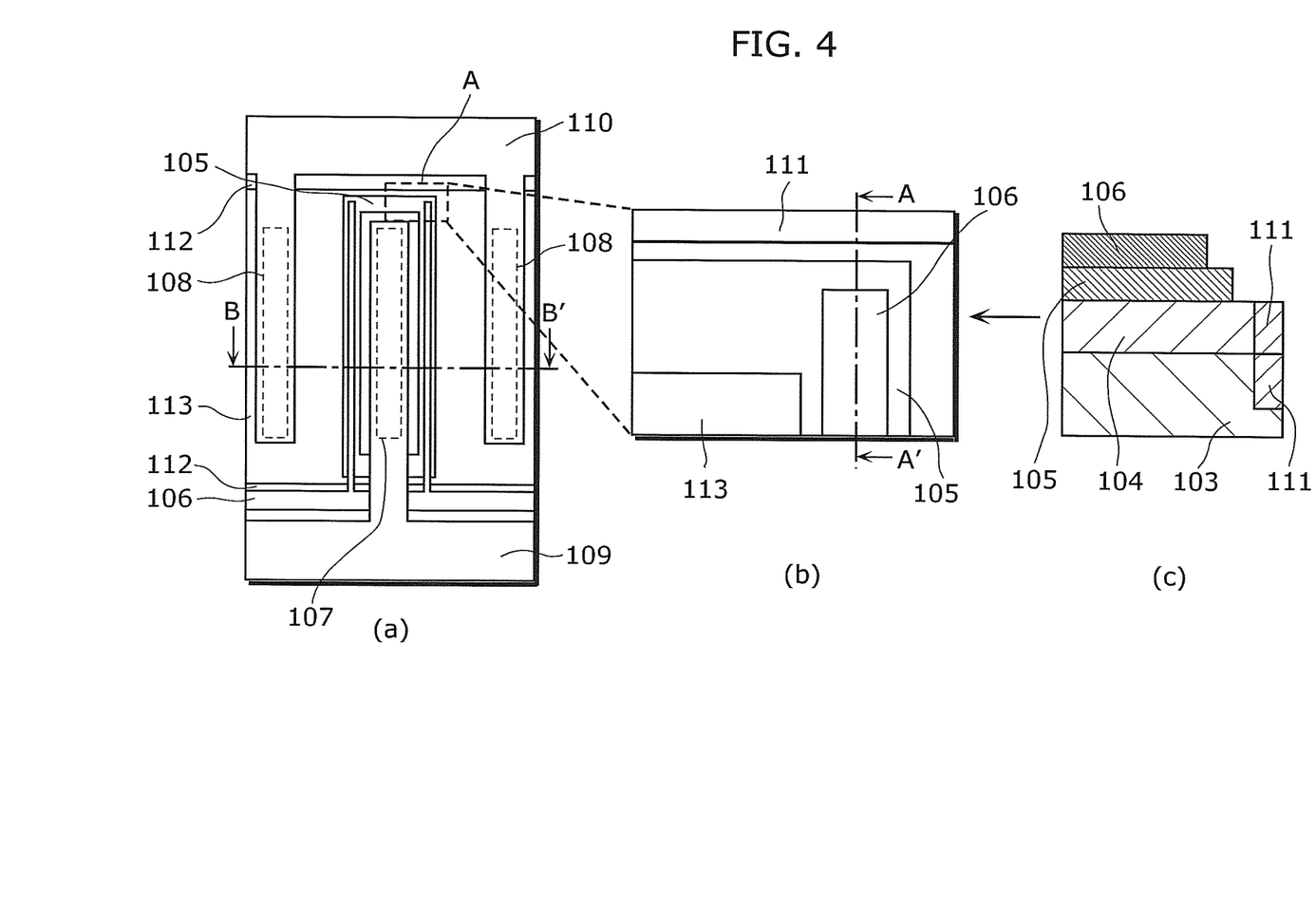
FIG. 4 includes, in (a), a top view showing a structure of a semiconductor device according to the first variation of the first embodiment of the present invention, and in (b), a top view showing a detailed structure of the semiconductor device (an enlarged view of an A part of (a)), and in (c), a cross-sectional view showing a detailed structure of the semiconductor device (a cross-sectional view taken along line A-A' of (b))

In FIG. 4, (a) is a top view showing a structure of a semiconductor device according to the first variation of the present embodiment, (b) is a top view showing a detailed structure of the semiconductor device (an enlarged view of an A part of (a)), and (c) is a cross-sectional view showing a detailed structure of the semiconductor device (a cross-sectional view taken along line A-A' of (b)). A cross-sectional view of the semiconductor device (a cross-sectional view taken along line B-B' of (a) in FIG. 4) is the same as that shown in FIG. 2.

The semiconductor device according to the present variation is different from the semiconductor device according to the present embodiment in that the inactive region 112 is formed at a remote position and therefore not in contact with the P-type GaN layer 105 and that the P-type GaN layer 105 is placed so as not to cross the interface between the inactive region 112 and the active region 113.

Even with this structure, the off-state leakage current at zero gate voltage can be reduced. However, since the region between the P-type GaN layer 105 and the inactive region 112 is included in the active region 113 but does not contribute to the drain current, the semiconductor device according to the present variation has a disadvantage that the parasitic capacitance and the element area are larger than those in the semiconductor device according to the present embodiment.

Second Variation

Figure 5:
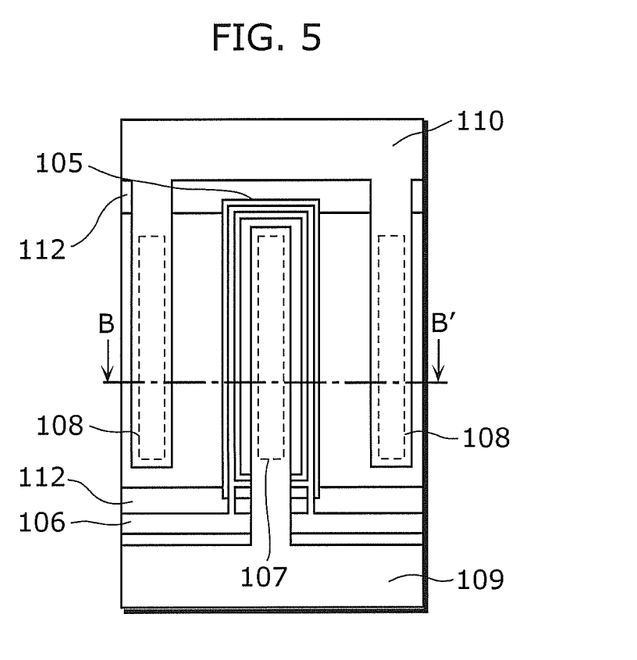
FIG. 5 is a top view showing a structure of a semiconductor device according to the second variation of the first embodiment of the present invention.

FIG. 5 is a top view showing a structure of a semiconductor device according to the second variation of the present embodiment. A cross-sectional view of the semiconductor device (a cross-sectional view taken along line B-B' of FIG. 5) is the same as that shown in FIG. 2.

The semiconductor device according to the present variation is different from the semiconductor device according to the present embodiment in that not only the P-type GaN layer 105 but also the gate electrode 106 is disposed to surround the source electrode 107.

When the hole concentration of the P-type GaN layer 105 is approximately $1 \times 10^{18}$ cm$^{-3}$, surrounding the source electrode 107 by the P-type GaN layer 105 only as in the semiconductor device according to the present embodiment will produce a sufficient effect of leakage current reduction. However, since the P-type GaN layer 105 has so low an activation rate of Mg as 10% or less, which makes it technically difficult to decrease the resistance, the structure of the semiconductor device according to the present variation in which also the gate electrode 106 surrounds the source electrode 107 is effective to reliably reduce the leakage current even in the case where the hole concentration is low.

Third Variation

Figure 6:
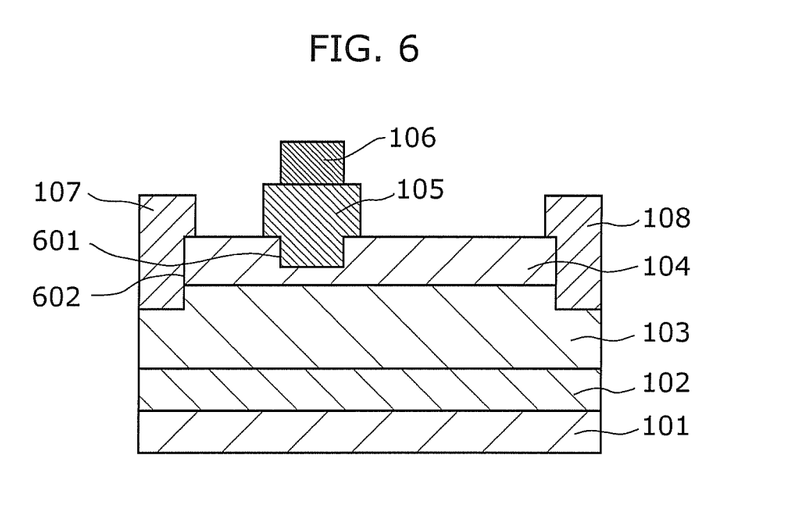
FIG. 6 is a cross-sectional view showing a structure of a semiconductor device according to the third variation of the first embodiment of the present invention (a cross-sectional view taken along line B-B' of (a) in FIG. 1)

FIG. 6 is a cross-sectional view showing a structure from the source electrode 107 to the drain electrode 108 of a semiconductor device according to the third variation of the present embodiment (a cross-sectional view taken along line B-B' of (a) in FIG. 1). A top view of the semiconductor device is the same as that shown in FIG. 1.

The semiconductor device according to the present variation is different from the semiconductor device according to the present embodiment in that a gate recess 601 is formed as a recess in the gate region (the region in which the gate electrode 106 and the P-type GaN layer 105 are provided) of the undoped AlGaN layer 104 and that, inside the gate recess 601, the P-type GaN layer 105 is formed so as to fill the gate recess 601. In addition, the semiconductor device according to the present variation is different from the semiconductor device according to the present embodiment in that an ohmic recess 602 is formed in the part of the undoped AlGaN layer 104 in which the source electrode 107 and the drain electrode 108 are provided and that the source electrode 107 and the drain electrode 108 are formed on the undoped GaN layer 103 so as to fill the ohmic recess 602. The gate recess 601 has a depth of 35 nm, for example, and the undoped AlGaN layer 104 underneath the gate recess 601 has a depth of 25 nm which is the same as the thickness of the undoped AlGaN layer 104 according to the present embodiment. The ohmic recess 602 penetrates the undoped AlGaN layer 104 and reaches inside the undoped GaN layer 103.

With the above structure, a normally off semiconductor device with a reduced off-state leakage current at zero gate voltage can be obtained, and since the undoped AlGaN layer 104 between the gate electrode 106 and the source electrode 107 and between the gate electrode 106 and the drain electrode 108 is thick; specifically 60 nm, the concentration of two-dimensional electron gas increases and the channel resistance is reduced, with the result that the on-resistance can be reduced.

Furthermore, since the channel between the gate electrode 106 and the drain electrode 108 is distanced from the surface, the influences due to the surface level can be reduced. As a result, the current collapse attributed to the surface level can be suppressed. The current collapse is considered to be caused by electrons trapped in the surface level. In the semiconductor device in which the current collapse takes place, the two-dimensional electron gas between the gate electrode 106 and the drain electrode 108 is depleted by the electrons trapped in the surface level of the undoped AlGaN layer 104 when a high drain bias of about several tens of voltages is applied in an OFF state. For the electrons trapped in the surface level, it takes longer to be discharged than to be captured, with the result that the depletion layer spreads out between the gate electrode 106 and the drain electrode 108 even immediately after the gate is turned on. It is therefore considered that the channel is not fully open, causing an increase in the channel resistance. In contrast, in the semiconductor device according to the present variation which includes the thick undoped AlGaN layer 104, the distance between the channel and the surface is large. This keeps the two-dimensional electron gas between the gate electrode 106 and the drain electrode 108 from being depleted even when a high drain bias is applied in an OFF state. Thus, even immediately after the gate is turned on, the channel is fully open, which does not increase the channel resistance.

Furthermore, in this structure, the source electrode 107 and the drain electrode 108 use side surfaces thereof to come into direct contact with the channel via the ohmic recess 602. With this structure, the contact resistance of the source electrode 107 and the drain electrode 108 can be reduced, with the result that the on-resistance can be reduced.

Fourth Variation

Figure 7:
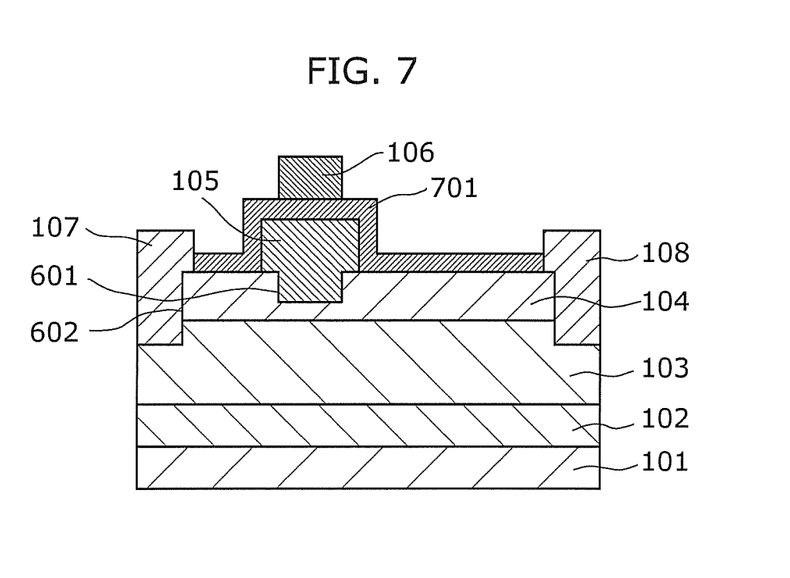
FIG. 7 is a cross-sectional view showing a structure of a semiconductor device according to the fourth variation of the first embodiment of the present invention (a cross-sectional view taken along line B-B' of (a) in FIG. 1)

FIG. 7 is a cross-sectional view showing a structure of a semiconductor device according to the fourth variation of the present embodiment (a cross-sectional view taken along line B-B' of (a) in FIG. 1). A top view of the semiconductor device is the same as that shown in FIG. 1.

The semiconductor device according to the present variation is different from the semiconductor device according to the third variation in that a gate insulating film 701 is further included and that the gate insulating film 701 made from, for example, SiN, is formed between the P-type GaN layer 105 and the gate electrode 106.

With the above structure, the current flowing from the gate electrode 106 to the P-type GaN layer 105 is blocked by the gate insulating film 701, which allows for a reduced gate current in addition to reduced leakage and reduced on-resistance which are advantages of the semiconductor device of FIG. 6.

Second Embodiment

Figure 8:
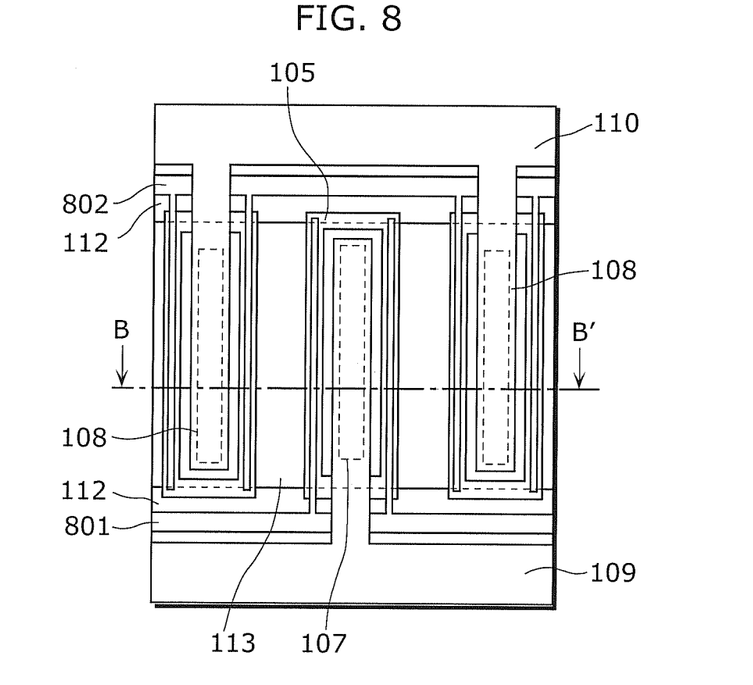
FIG. 8 is a top view showing a structure of a semiconductor device according to the second embodiment of the present invention.
Figure 9:
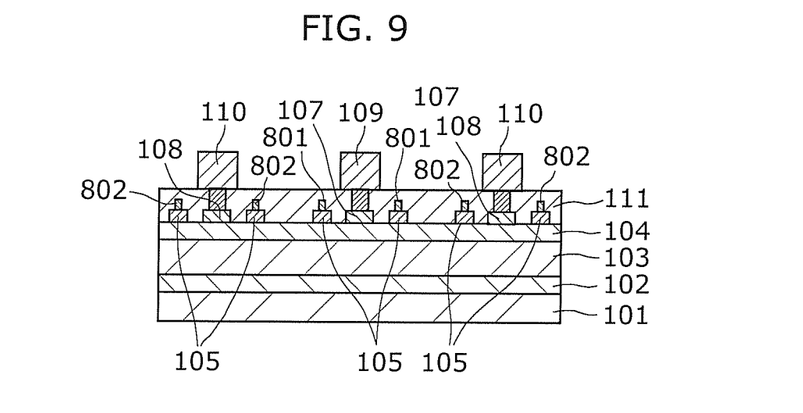
FIG. 9 is a cross-sectional view showing a detailed structure of the semiconductor device according to the second embodiment of the present invention (a cross-sectional view taken along line B-B' of FIG. 8)

FIG. 8 is a top view showing a structure of a semiconductor device according to the second embodiment of the present embodiment. FIG. 9 is a cross-sectional view showing a detailed structure of the semiconductor device (a cross-sectional view taken along line B-B' in FIG. 8).

The semiconductor device according to the present embodiment is different from the semiconductor device according to the first embodiment in that, as shown in FIG. 9, a first gate electrode 801 is located on the P-type GaN layer 105 which is present close to the source electrode 107, and a second gate electrode 802 is located on the P-type GaN layer 105 which is present close to the drain electrode 108, and that these two gate electrodes are present between the source electrode 107 and the drain electrode 108. In other words, the semiconductor device according to the present embodiment is different from the semiconductor device according to the first embodiment in that the two separate P-type GaN layers 105 are provided between the source electrode 107 and the drain electrode 108, and one of the P-type GaN layers 105 is disposed to surround the source electrode 107 while the other of the P-type GaN layers 105 is disposed to surround the drain electrode 108. This structure is called a double gate structure and provides a bidirectional switching element that allows current flow in both the directions from the source side and the drain side.

In the semiconductor device according to the present embodiment, the two separate gate electrodes are provided, and one of the gate electrodes, namely the first gate electrode 801, is formed on the P-type GaN layer 105 which surrounds the source electrode 107 while the other of the gate electrodes, namely the second gate electrode 802, is formed on the P-type GaN layer 105 which surrounds the drain electrode 108.

As shown in FIG. 8, with the structure in which the P-type GaN layer 105 which is connected to the first gate electrode 801 surrounds the source electrode 107, and the P-type GaN layer 105 which is connected to the second gate electrode 802 surrounds the drain electrode 108, it is possible to reduce the off-state leakage current also in the double gate structure, as in the case of the semiconductor device according to the first embodiment. Thus, the semiconductor device according to the present embodiment is a normally off transistor.

The inactive region 112 formed by ion implantation is in contact with both the P-type GaN layer 105 which is connected to the first gate electrode 801 and the P-type GaN layer 105 which is connected to the second gate electrode 802, and a part of both of the P-type GaN layers 105 (a part of the inactive region 112) has a structure with the resistance increased by ion implantation. With this structure, the parasitic capacitance is reduced, and the active region 113 is limited to only an effective region so that the element area can be smaller.

While the semiconductor device according to an implementation of the present invention has been described above based on the embodiments, the present invention is not limited to these embodiments. The scope of the present invention includes other embodiments that are obtained by making various modifications that those skilled in the art could think of, to the present embodiments, without departing from the spirit of the present invention. It may also be possible to combine constituents in different embodiments without departing from the spirit of the present invention.

For example, while the above embodiments describe examples of the semiconductor device using a sapphire substrate, the material of the substrate may be Si or SiC and is not limited to sapphire as long as it can form a nitride semiconductor layer.

Furthermore, the first nitride semiconductor layer according to an implementation of the present invention is exemplified by the undoped GaN layer in the above embodiments, but not limited to the undoped GaN layer as long as the layer is made from $Al_xGa_{1-x}N$ ($0 \le x \le 1$). Likewise, the second nitride semiconductor layer according to an implementation of the present invention is exemplified by the undoped AlGaN layer in the above embodiments, but not limited to the undoped AlGaN layer as long as the layer is made from $Al_yGa_{1-y}N$ ($0<y \le 1$). Furthermore, the third nitride semiconductor layer according to an implementation of the present invention is exemplified by the GaN layer in the above embodiments, but not limited to the GaN layer as long as the layer is made from $Al_zGa_{1-z}N$ ($0 \le z \le 1$).

In addition, while the P-type GaN layer and the gate electrode are disposed to surround the source electrode in the first embodiment, they may be disposed to surround the drain electrode because it is sufficient that they are disposed to surround at least one of the drain electrode and the source electrode.

INDUSTRIAL APPLICABILITY

The present invention is useful as a semiconductor device; specifically, as a power switching element or the like for use in a power supply circuit or the like of a consumer appliance such as a television.

What is claimed is:

1. A semiconductor device comprising:
   a substrate;
   a first nitride semiconductor layer formed above said substrate;
   a second nitride semiconductor layer formed on said first nitride semiconductor layer and having a higher bandgap energy than said first nitride semiconductor layer;
   a source electrode and a drain electrode which are formed on one of said first nitride semiconductor layer and said second nitride semiconductor layer;
   a third nitride semiconductor layer of P-type conductivity formed on said second nitride semiconductor layer and disposed between said source electrode and said drain electrode; and
   a gate electrode formed on said third nitride semiconductor layer,
   wherein said first nitride semiconductor layer includes an active region and an inactive region, the active region including a channel, and the inactive region not including the channel, and
   said third nitride semiconductor layer is disposed to surround at least one of said source electrode and said drain electrode.

2. The semiconductor device according to claim 1, wherein the inactive region is formed by ion implantation of non-conducting impurities.

3. The semiconductor device according to claim 1, wherein said third nitride semiconductor layer is disposed so as to cross an interface between the inactive region and the active region.

4. The semiconductor device according to claim 1, wherein said third nitride semiconductor layer is disposed so as not to cross an interface between the inactive region and the active region.

5. The semiconductor device according to claim 1, wherein said gate electrode is disposed to surround one of said source electrode and said drain electrode.

6. The semiconductor device according to claim 1, wherein a recess is formed in said second nitride semiconductor layer, and
said third nitride semiconductor layer is formed in the recess.

7. The semiconductor device according to claim 1, further comprising
an insulating film formed between said third nitride semiconductor layer and said gate electrode.

8. The semiconductor device according to claim 1, wherein said first nitride semiconductor layer includes $Al_xGa_{1-x}N$ ($0 \le x \le 1$),
said second nitride semiconductor layer includes $Al_yGa_{1-y}N$ ($0<y \le 1$), and
said third nitride semiconductor layer includes $Al_zGa_{1-z}N$ ($0 \le z \le 1$).

9. The semiconductor device according to claim 1, which is a normally off transistor.

10. The semiconductor device according to claim 1, wherein two third nitride semiconductor layers each of which is said third nitride semiconductor layer are provided between said source electrode and said drain electrode,
one of said two third nitride semiconductor layers is disposed to surround said source electrode, and the other of said two third nitride semiconductor layers is disposed to surround said drain electrode,
two gate electrodes each of which is said gate electrode are provided, and
a first gate electrode that is one of said two gate electrodes is formed on said third nitride semiconductor layer which surrounds said source electrode, and a second gate electrode that is the other of said two gate electrodes is formed on said third nitride semiconductor layer which surrounds said drain electrode.

11. The semiconductor device according to claim 10, wherein said third nitride semiconductor layer is disposed so as to cross an interface between the inactive region and the active region.

12. The semiconductor device according to claim 10, wherein said gate electrode is disposed to surround one of said source electrode and said drain electrode.

13. The semiconductor device according to claim 10, wherein a recess is formed in said second nitride semiconductor layer, and
said third nitride semiconductor layer is formed in the recess.

14. The semiconductor device according to claim 10, further comprising
   an insulating film formed between said third nitride semiconductor layer and said gate electrode.

15. The semiconductor device according to claim 10, wherein said first nitride semiconductor layer includes $Al_xGa_{1-x}N$ ($0 \leq x \leq 1$),
   said second nitride semiconductor layer includes $Al_yGa_{1-y}N$ ($0 < y \leq 1$), and
   said third nitride semiconductor layer includes $Al_zGa_{1-z}N$ ($0 \leq z \leq 1$).

16. The semiconductor device according to claim 10, which is a normally off transistor.

\* \* \* \* \*